(12) United States Patent
Uesaka et al.

(10) Patent No.: US 9,395,504 B2
(45) Date of Patent: Jul. 19, 2016

(54) SYSTEM TO CONTROL WAVELENGTH AND METHOD TO CONTROL WAVELENGTH

(71) Applicants: Sumitomo Electric Industries, Ltd., Osaka (JP); National Institute of Advanced Industrial Science and Technology, Tokyo (JP)

(72) Inventors: Katsumi Uesaka, Yokohama (JP); Eiichi Banno, Yokohama (JP); Hajime Shoji, Yokohama (JP); Hiroyuki Matsuura, Tsukuba (JP); Haruhiko Kuwatsuka, Tsukuba (JP); Ken Tanizawa, Tsukuba (JP); Shu Namiki, Tsukuba (JP)

(73) Assignees: Sumitomo Electric Industries, Ltd., Osaka-shi (JP); National Institute of Advanced Industrial Science and Technology, Tokyo (JP)

(*) Notice: Subject to any disclaimer, the term of this patent is extended or adjusted under 35 U.S.C. 154(b) by 0 days.

(21) Appl. No.: 14/489,147

(22) Filed: Sep. 17, 2014

(65) Prior Publication Data

US 2015/0076990 A1 Mar. 19, 2015

(30) Foreign Application Priority Data

Sep. 19, 2013 (JP) ................................. 2013-193916

(51) Int. Cl.
*H05B 33/08* (2006.01)
*G02B 6/42* (2006.01)
(Continued)

(52) U.S. Cl.
CPC ............. *G02B 6/4215* (2013.01); *G01J 1/4257* (2013.01); *G01J 2001/4247* (2013.01); *H01S 5/0687* (2013.01)

(58) Field of Classification Search
CPC ..... G01J 9/0246; G01J 3/0263; G01J 3/0275; H01S 5/0612; H01S 5/142
See application file for complete search history.

(56) References Cited

U.S. PATENT DOCUMENTS

| | | | | |
|---|---|---|---|---|
| 6,043,883 | A * | 3/2000 | Leckel | G01J 9/0246 356/454 |
| 6,621,580 | B2 * | 9/2003 | Myatt | G01J 9/0246 356/454 |

(Continued)

FOREIGN PATENT DOCUMENTS

| | | |
|---|---|---|
| JP | 62-144033 | 6/1987 |
| JP | 10-339668 | 12/1998 |

(Continued)

OTHER PUBLICATIONS

McGraw-Hill Dictionary of Scientific and Technical Terms, Sixth Edition, 2003.*

*Primary Examiner* — Don Le
(74) *Attorney, Agent, or Firm* — Venable LLP; Michael A. Sartori; Laura G. Remus

(57) ABSTRACT

A system includes: a splitter to branch an optical signal output by a wavelength-tunable light source into first to third optical signals; a first photodiode to perform an optical electrical conversion of the first optical signal transmitting a first etalon; a second photodiode to perform an optical electrical conversion of the second optical signal transmitting a second etalon, an FSR of the second etalon being identical to that of the first etalon, peak wavelengths of intensity of a transmitted light of the second etalon being different from those of the first etalon; a third photodiode to perform an optical electrical conversion of the third optical signal; and a controller to control the wavelength-tunable light source with use of a coefficient calculated by following formulas (1) or (2), Coefficient= $(PD1-A \cdot PD3)/(PD2-B \cdot PD3)$ (1) and Coefficient= $(PD2-B \cdot PD3)/(PD1-A \cdot PD3)$ (2).

15 Claims, 12 Drawing Sheets

(51) Int. Cl.
*G01J 1/42* (2006.01)
*H01S 5/0687* (2006.01)

(56) References Cited

U.S. PATENT DOCUMENTS

| | | | |
|---|---|---|---|
| 6,678,480 B1 * | 1/2004 | Aoki | G02B 6/4215 398/183 |
| 6,782,017 B1 | 8/2004 | Kai et al. | |
| 7,092,416 B2 | 8/2006 | Kathman et al. | |
| 2001/0033592 A1 | 10/2001 | Yamauchi et al. | |
| 2002/0080367 A1 | 6/2002 | Asami | |
| 2002/0081065 A1 | 6/2002 | Asami | |
| 2003/0035119 A1 * | 2/2003 | Myatt | G01J 9/0246 356/519 |

FOREIGN PATENT DOCUMENTS

| | | |
|---|---|---|
| JP | 2000-323784 A | 11/2000 |
| JP | 2001-308444 A | 11/2001 |
| JP | 2002-196131 A | 7/2002 |
| JP | 2002-202190 A | 7/2002 |
| JP | 4239507 B2 | 3/2009 |
| WO | WO-95/20144 | 7/1995 |

* cited by examiner

FIG. 1 FIRST COMPARATIVE EXAMPLE

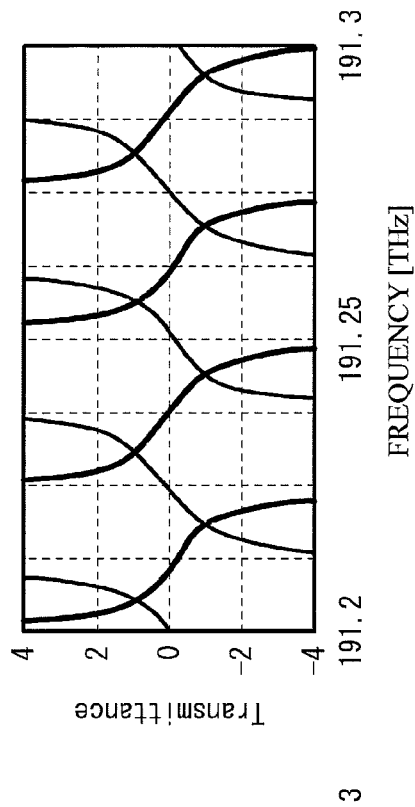
FIG. 11A   FSR/4 −12%
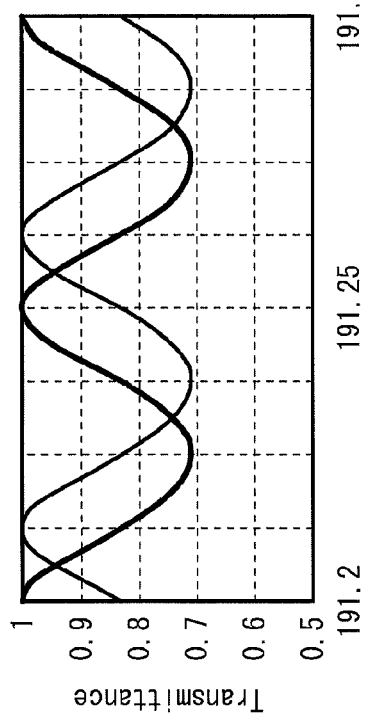
FIG. 11B
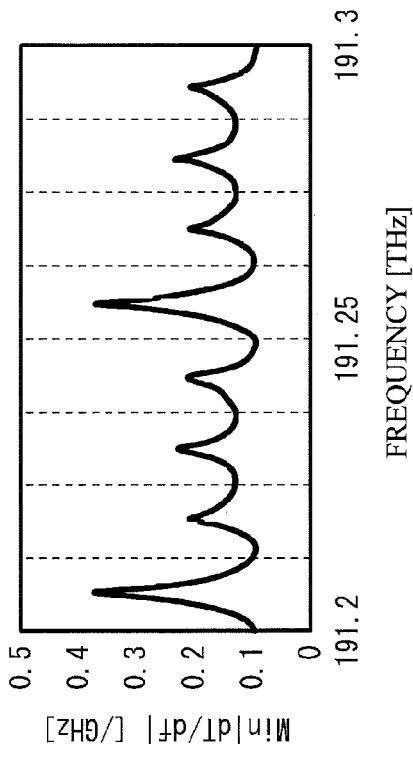
FIG. 11C
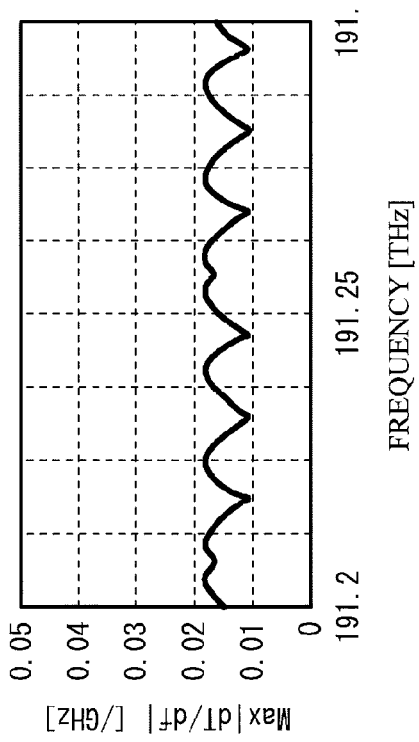
FIG. 11D

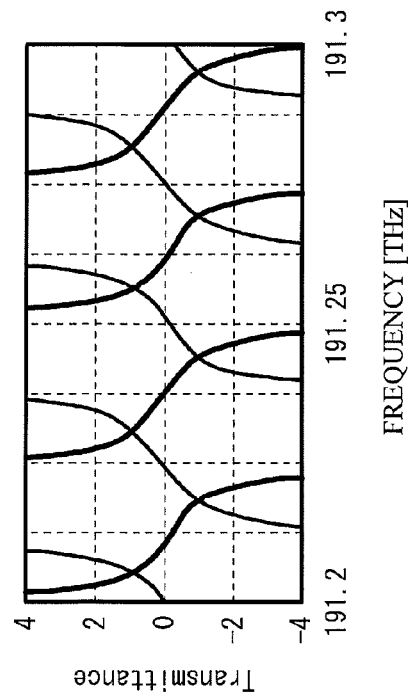
FIG. 12A FSR/4 +12%
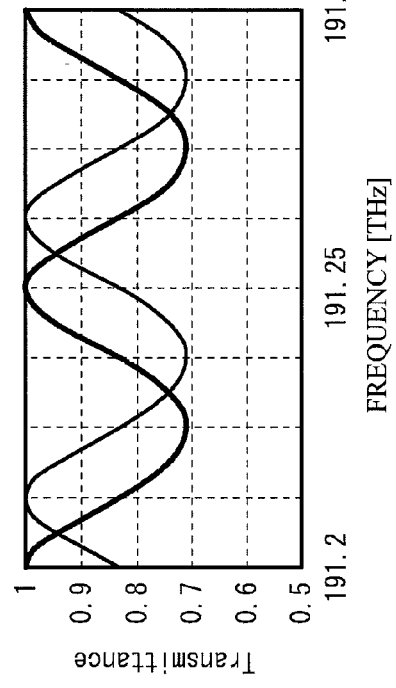
FIG. 12B
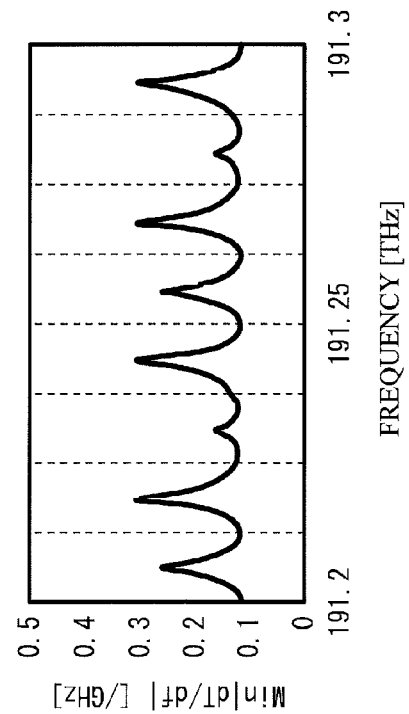
FIG. 12C
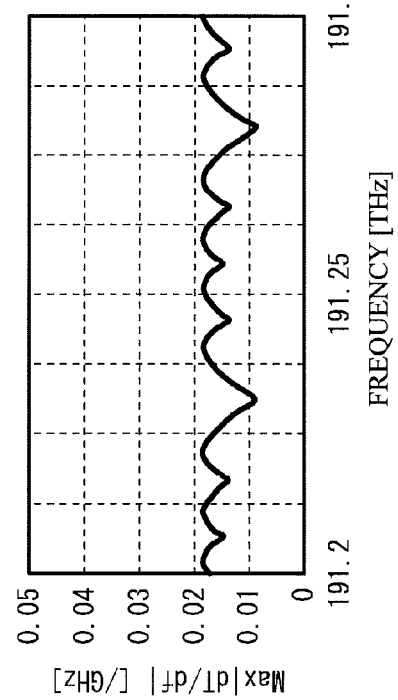
FIG. 12D

SYSTEM TO CONTROL WAVELENGTH AND METHOD TO CONTROL WAVELENGTH

CROSS-REFERENCE TO RELATED APPLICATION

This application is based upon and claims the benefit of priority of the prior Japanese Patent Application No. 2013-193916, filed on Sep. 19, 2013, the entire contents of which are incorporated herein by reference.

BACKGROUND (i) Technical Field

The present invention relates to a system to control a wavelength and a method to control a wavelength.

(ii) Related Art

Japanese Patent Application Publication No. 2001-308444 (hereinafter referred to as Document 1) discloses a technology in which a first photodiode to monitor a light transmitting an optical filter having a periodic function of a wavelength and a second photodiode to monitor whole optical power of an incident light into the optical filter are provided, and a wavelength is monitored with use of outputs of the two photodiodes.

And, Japanese Patent Application Publications No. 2002-196131 (hereinafter referred to as Document 2) and No. 2002-202190 (hereinafter referred to as Document 3) disclose a technology in which a wavelength is monitored with use of outputs of two photodiodes that monitors two optical beam transmitting an optical filter achieving two characteristics of optical transmission characteristics in which an amplitude period is relatively shifted from a single etalon filter by $\pi/2$.

SUMMARY

It is an object to provide a system to control a wavelength and a method to control a wavelength that are capable of controlling a wavelength with high accuracy at a high speed.

According to an aspect of the present invention, there is provided a system to control a wavelength including: a splitter configured to branch an optical signal output by a wavelength-tunable light source into a first to a third optical signals; a first photodiode configured to perform an optical electrical conversion of the first optical signal transmitting a first etalon; a second photodiode configured to perform an optical electrical conversion of the second optical signal transmitting a second etalon, an FSR of the second etalon being identical to that of the first etalon, peak wavelengths of intensity of a transmitted light of the second etalon being different from those of the first etalon; a third photodiode configured to perform an optical electrical conversion of the third optical signal; and a controller configured to control the wavelength-tunable light source with use of a coefficient calculated by following formulas (1) or (2), a coefficient= $(PD1-A \cdot PD3)/(PD2-B \cdot PD3)$ (1), a coefficient= $(PD2-B \cdot PD3)/(PD1-A \cdot PD3)$ (2), wherein: PD1 is an output of the first photodiode; PD2 is an output of the second photodiode; PD3 is an output of the third photodiode; A is an average of a ratio of PD1 with respect to PD3; and B is an average of a ratio of PD2 with respect to PD3.

According to an aspect of the present invention, there is provided a method to control a wavelength including: branching an optical signal output by a wavelength-tunable light source into a first to a third optical signals; performing an optical electrical conversion of the first optical signal transmitting a first etalon with a first photodiode; performing an optical electrical conversion of the second optical signal transmitting a second etalon with a second photodiode, an FSR of the second etalon being identical to that of the first etalon, peak wavelengths of intensity of a transmitted light of the second etalon being different from those of the first etalon; performing an optical electrical conversion of the third optical signal with a third photodiode; and controlling the wavelength-tunable light source with use of a coefficient calculated by following formulas (1) or (2), a coefficient= $(PD1-A \cdot PD3)/(PD2-B \cdot PD3)$ (1), a coefficient= $(PD2-B \cdot PD3)/(PD1-A \cdot PD3)$ (2), wherein: PD1 is an output of the first photodiode; PD2 is an output of the second photodiode; PD3 is an output of the third photodiode; A is an average of a ratio of PD1 with respect to PD3; and B is an average of a ratio of PD2 with respect to PD3.

BRIEF DESCRIPTION OF THE DRAWINGS

FIG. 11A to FIG. 11D illustrate transmission characteristics of two etalons; and FIG. 12A to FIG. 12D illustrate transmission characteristics of two etalons.

DETAILED DESCRIPTION

A wavelength band corresponding to a peak or a valley of a transmission characteristics of an etalon is a dead band. With the technology of Document 1, it is difficult to monitor a wavelength in the dead band. In order to monitor an arbitrary wavelength, it is necessary to shift a position of the peak or the valley of the wavelength characteristic by changing a temperature or an angle of an etalon filter. In this case, a high-speed operation is difficult. With the technology of Document 2, in order to remove the dead band, a region in which outputs of the both monitors overlap with each other is needed. However, in the region, a differential coefficient (monitor sensitivity) of the transmission characteristic of a filter gets smaller. With the technology of Document 3, it is not possible to distinguish between a changing of a wavelength and changing of optical power, because the whole optical power input into a filter is not monitored.

In order to establish an optical communication system having large capacity solving explosive increase of an internet traffic, usage of an effective wavelength resource is needed. Now, a fixed grid method in which wavelengths are multiplexed at an interval of 100 GHz or 50 GHz is a main stream. However, introduction of a flex grid system allowing usage of integral multiple of 6.25 GHz regulated in ITU-T G.694.1 or a grid less system using an arbitrary wavelength is under view.

A wavelength-tunable light source used in the system is often combined with a wavelength locker for stabilizing an oscillation wavelength. In this case, when a wavelength locker monitors an output wavelength of a wavelength-tunable light source and performs a negative feedback control with use of a monitor output, the output wavelength can be stabilized.

Figure 1:
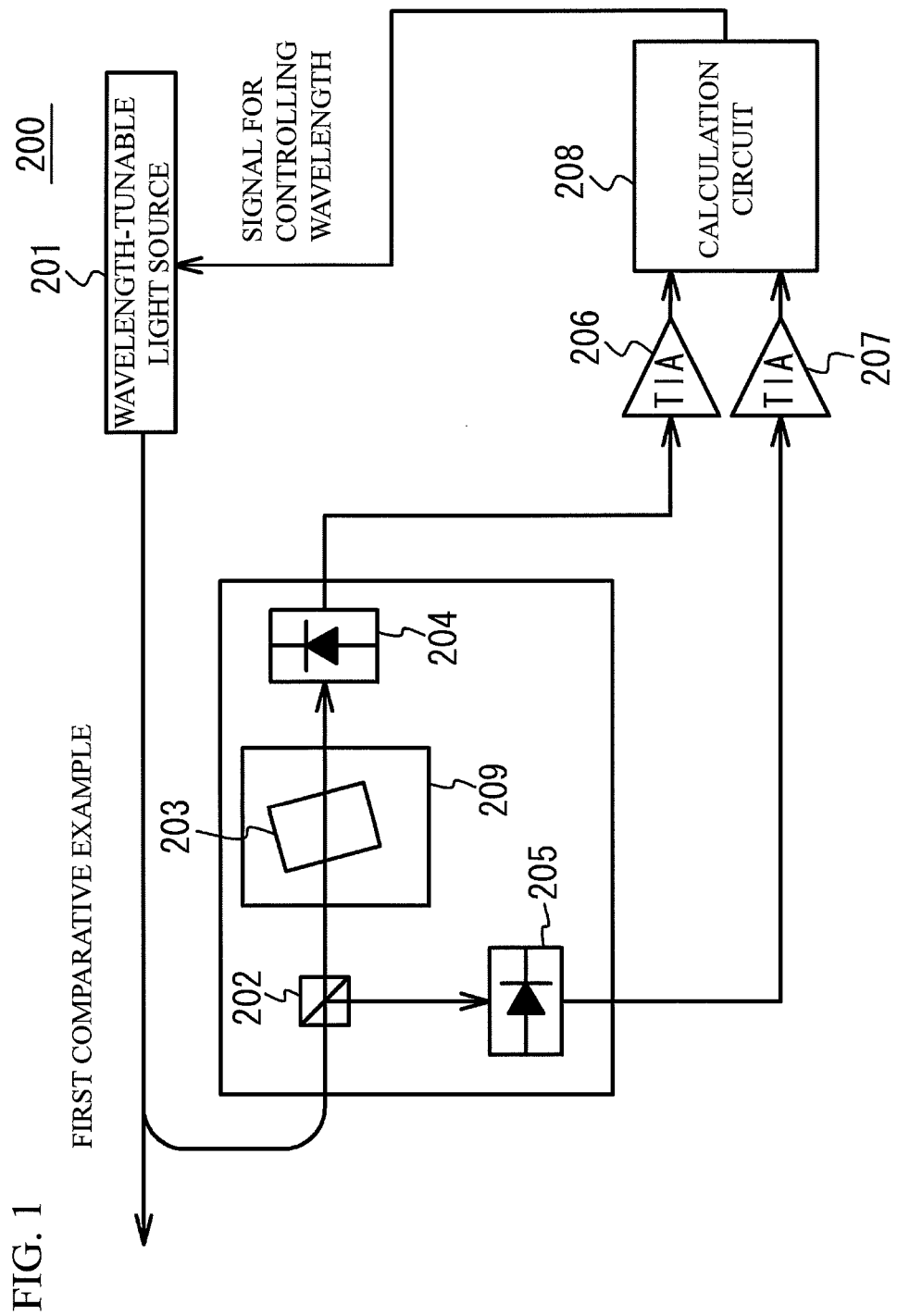
FIG. 1 illustrates a structure example of a system to control a wavelength in accordance with a first comparative example.

FIG. 1 illustrates a structure example of a system 200 to control a wavelength in accordance with a first comparative example. As illustrated in FIG. 1, a part of a light of a single wavelength output by a wavelength-tunable light source 201 is input into a beam splitter 202. One of two branched lights output by the beam splitter 202 transmits an etalon 203 and is input into a first photodiode 204. The other is input into a second photodiode 205 without transmitting an etalon. A transmission characteristic of the etalon 203 changes periodically with respect to a frequency. When the etalon 203 is used, a changing of a frequency is converted into a changing of optical intensity. It is therefore possible to detect a wavelength output by the wavelength-tunable light source 201 by detecting a ratio of an output of the first photodiode 204 and an output of the second photodiode 205.

A current signal obtained by an optical electrical conversion of the first photodiode 204 is input into a TIA (Trans Impedance Amplifier) 206. The TIA 206 converts the current signal output by the first photodiode 204 into a voltage signal, and input the voltage signal into a calculation circuit 208. A current signal obtained by an optical electrical conversion of the second photodiode 205 is input into a TIA 207. The TIA 207 converts the current signal output by the second photodiode 205 into a voltage signal, and input the voltage signal into the calculation circuit 208. The calculation circuit 208 detects an output wavelength of the wavelength-tunable light source 201 based on the voltage signals input by the TIAs 206 and 207, and inputs a signal for controlling a wavelength of the wavelength-tunable light source 201 into the wavelength-tunable light source 201 with use of a result of the detection. Thus, a wavelength of the wavelength-tunable light source 201 is controlled to be a desirable wavelength.

Figure 2:
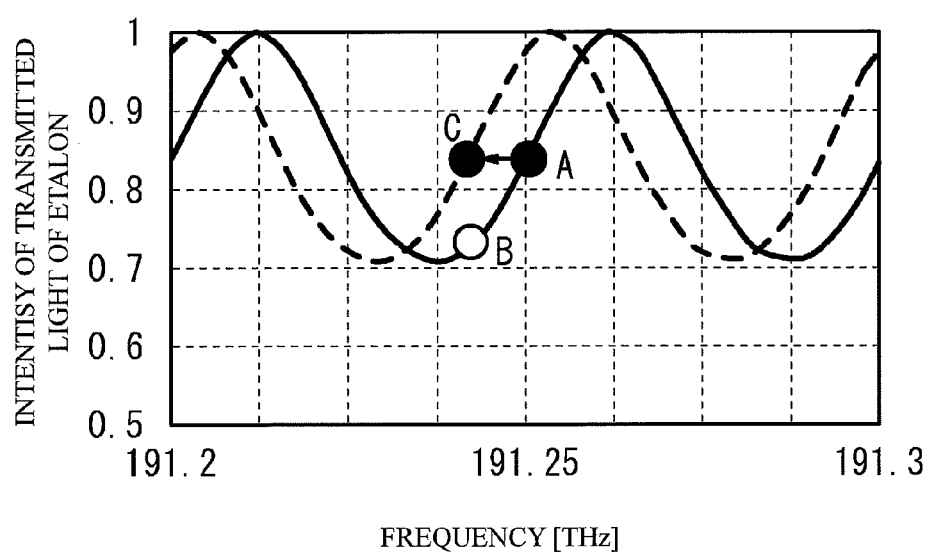
FIG. 2 illustrates a transmission characteristic of an etalon.

FIG. 2 illustrates the transmission characteristic of the etalon 203. As indicated by a solid line of FIG. 2, peaks of intensity of a transmitted light of the etalon 203 appear periodically with respect to a frequency. In order to convert the changing of a frequency to the changing of intensity, it is preferable that a wavelength is monitored with use of slope portions of the transmission characteristic (for example, a point A). This is because in the slope portions, the changing of intensity with respect to a frequency is large.

When an etalon having an FSR (Free Spectral Range) of 50 GHz in a system of which grid is fixed to 50 GHz, it is possible to use slope characteristics that are approximately identical at all wavelengths. In this case, it is required that the etalon 203 has a precise characteristic as a wavelength reference (frequency reference). For example, a device 209 to control a temperature keeps a temperature of the etalon 203 constant so that a desirable transmission characteristic is achieved, because the transmission characteristic of the etalon 203 fluctuates according to a temperature thereof. The device 209 to control a temperature is, for example, a TEC (Thermo Electric Cooler) and includes a Peltier element.

When the system 200 to control a wavelength is applied to a flex grid system or a grid less system, a monitored position of a wavelength may be shifted to a point B of FIG. 2. In peak portions or valley portions of the transmission characteristic of the etalon 203, a differential gain for converting the changing of a frequency to the changing of intensity is small. It is difficult to control a wavelength in the portions. Alternately, the portions may be dead bands.

In order to remove the dead band in the system 200 to control a wavelength, it is necessary to shift the transmission characteristic of the etalon 203 from a solid line to a broken line of FIG. 2 by changing the temperature of the etalon 203 or the angle of the etalon 203. This is because the monitored position of a wavelength becomes a point C of the slope portion, and a differential gain that is the same as that of the point A can be achieved. However, there are disadvantages in a time for temperature control, power consumption or the like that are necessary for a changing of an operation condition of the etalon 203.

When the FSR of the etalon 203 is reduced (for example, FSR=12.5 GHz) in order to enhance settable resolving power, a controllable range may be reduced. Therefore, an actual difficulty increases because it is necessary to adjust an initial value to be set in advance around a target lock point.

Figure 3:
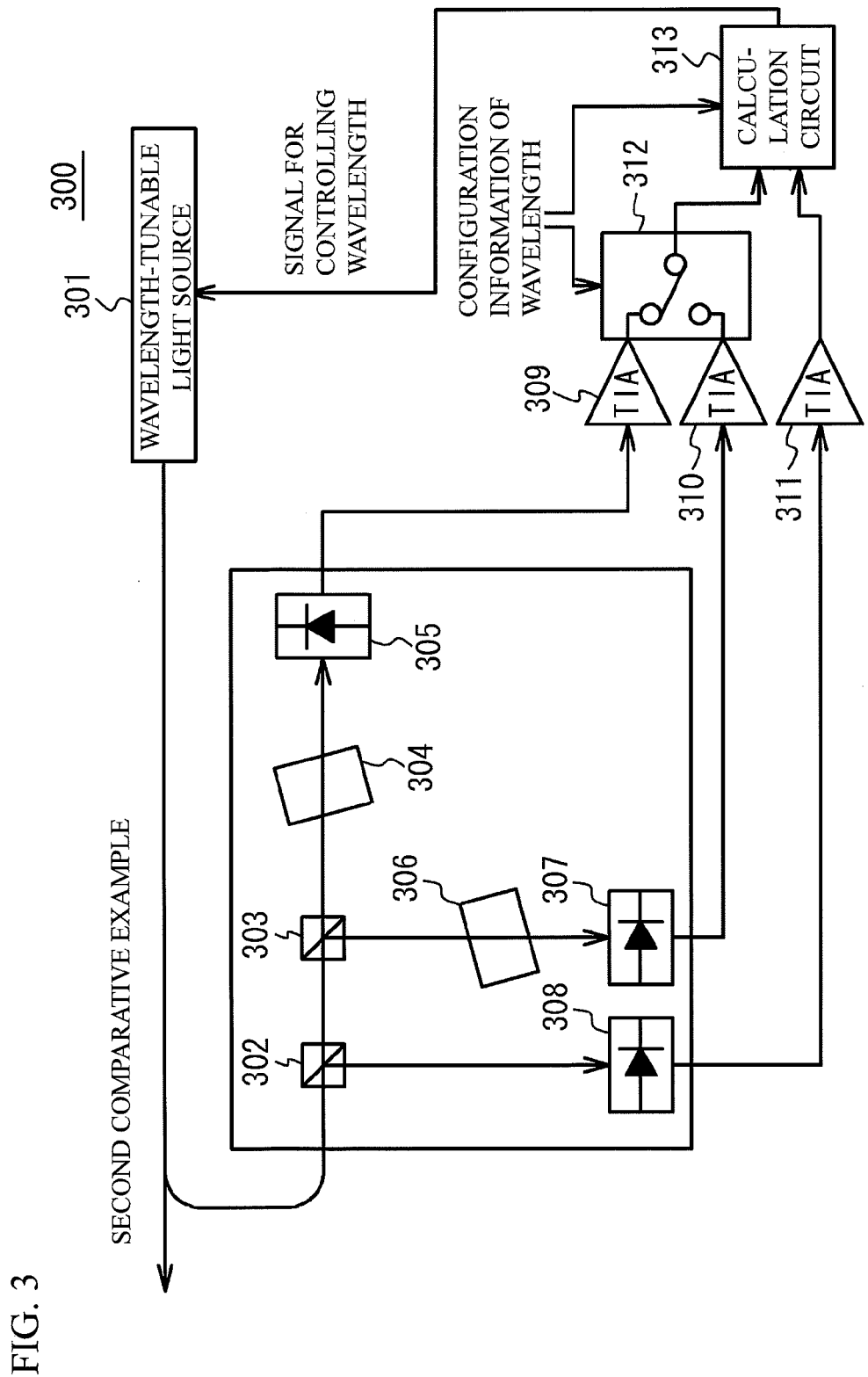
FIG. 3 illustrates a structure example of a system to control a wavelength in accordance with a second comparative example.

In view of the problem, it is thought of a system 300 to control a wavelength in accordance with a second comparative example. FIG. 3 illustrates a structure example of the system 300 to control a wavelength. As illustrated in FIG. 3, a part of a light of a single wavelength output by a wavelength-tunable light source 301 is input into a beam splitter 302. One of two branched lights output by the beam splitter 302 is input into a beam splitter 303. One of two branched lights output by the beam splitter 303 transmits a first etalon 304 and is input into a first photodiode 305. The other of the two branched lights output by the beam splitter 303 transmits a second etalon 306 and is input into a second photodiode 307. The other of the two branched lights output by the beam splitter 302 is input into a third photodiode 308 without transmitting an etalon.

A current signal obtained by an optical electrical conversion of the first photodiode 305 is input into a TIA 309. The TIA 309 converts the current signal output by the first photodiode 305 into a voltage signal, and input the voltage signal into a switch 312. A current signal obtained by an optical electrical conversion of the second photodiode 307 is input into a TIA 310. The TIA 310 converts the current signal output by the second photodiode 307 into a voltage signal, and input the voltage signal into the switch 312. A current signal obtained by an optical electrical conversion of the third photodiode 308 is input into a TIA 311. The TIA 311 converts the current signal output by the third photodiode 308 into a voltage signal, and input the voltage signal into a calculation circuit 313. The switch 312 inputs one of output electrical signals of the TIAs 309 and 310 in accordance with configuration information of a wavelength into the calculation circuit 313.

Figure 4:
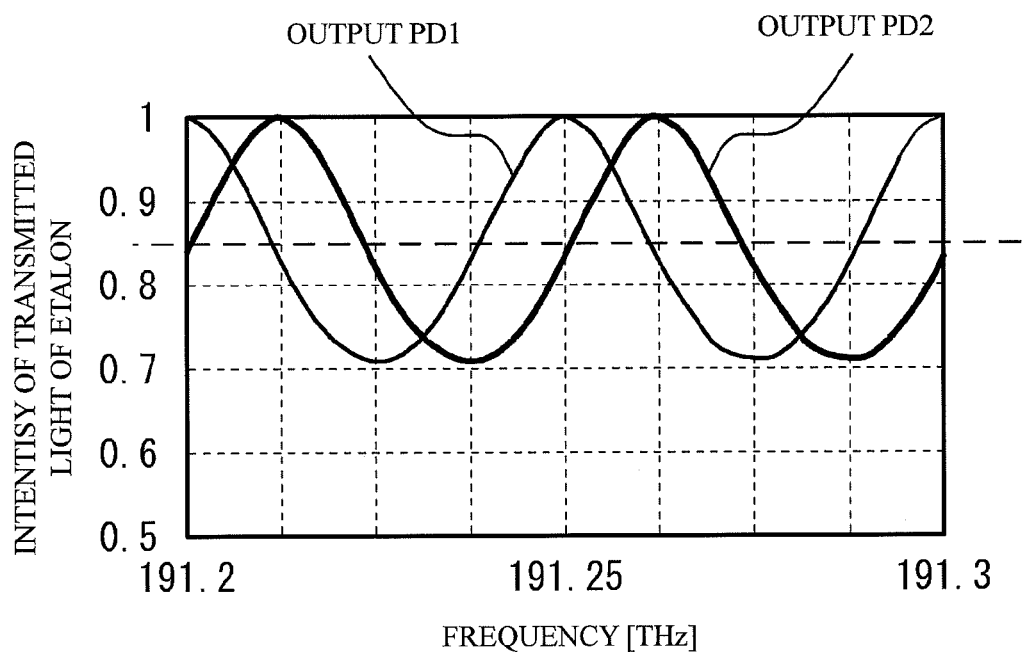
FIG. 4 illustrates transmission characteristics of a first etalon and a second etalon.

FIG. 4 illustrates transmission characteristics of the first etalon 304 and the second etalon 306. In FIG. 4, a thin line indicates an output of the first photodiode 305. A thick line indicates an output of the second photodiode 307. As illustrated in FIG. 4, the first etalon 304 and the second etalon 306 have an identical FSR. The transmission characteristic of the first etalon 304 is shifted by FSR/4 ($\pi/2$ in phase) in a frequency direction with respect to the transmission characteristic of the second etalon 306. Thus, the peaks and the valleys of the transmission characteristic of the first etalon 304 do not overlap with those of the transmission characteristic of the second etalon 306. When the output of the first photodiode 305 is close to the peaks or the valleys (dead band) of the transmission characteristic of the first etalon 304, the output of the second photodiode 307 may be used for generating a signal for controlling a wavelength. On the other hand, when the output of the second photodiode 307 is on the dead band, the output of the first photodiode 305 may be used. With the operation, the dead bands are removed in all wavelengths band.

Figure 5A:
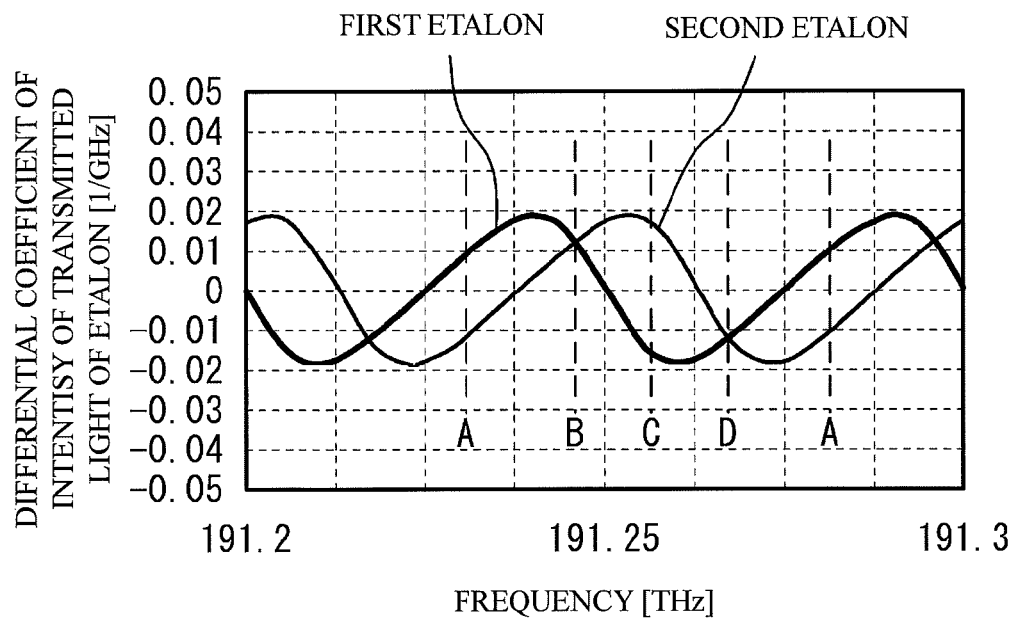
FIG. 5A illustrates a graph indicating differential coefficients of two transmission characteristics illustrated in FIG. 4.
Figure 5B:
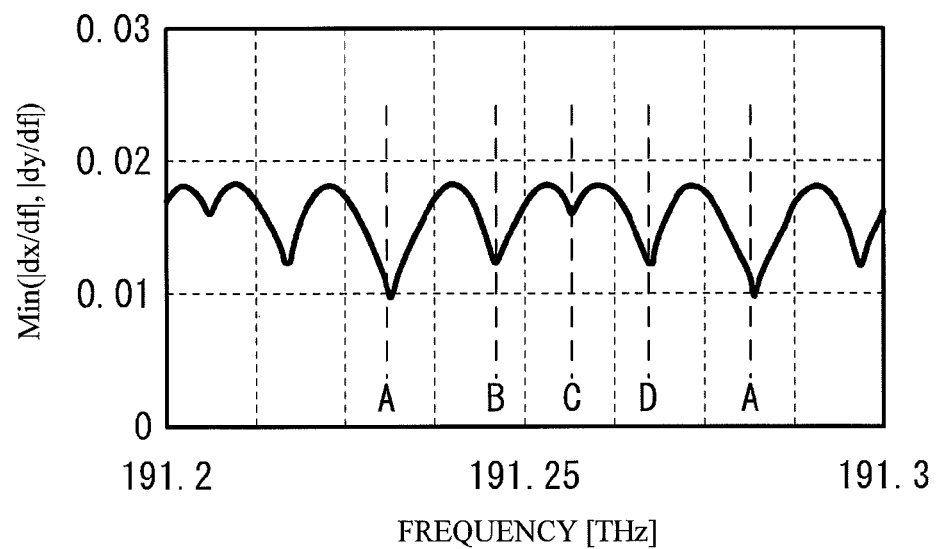
FIG. 5B illustrates a graph obtained by tracing one of two differential gains having a larger absolute value of two curves of FIG. 5A.

FIG. 5A illustrates a graph indicating differential coefficients of the two transmission characteristics illustrated in FIG. 4. FIG. 5B illustrates a graph obtained by tracing one of the two differential gains having a larger absolute value of the two curves. It is possible to control a wavelength with larger differential gains by using the output of the first photodiode 305 (differential coefficient is positive) from a point A to a point B, the output of the second photodiode 307 (differential coefficient is positive) from the point B to a point C, the output of the first photodiode 305 (differential coefficient is negative) from the point C to a point D and the output of the second photodiode 307 (the differential coefficient is negative) from the point D to the point A. The switch 312 determines which of the outputs of the first photodiode 305 and the second photodiode 307 is used, in accordance with the configuration information of a wavelength from outside. The calculation circuit 313 determines a target value of the monitor value according to the configuration information of a wavelength.

However, with the method, even if the wavelength control is performed with use of the output of the first photodiode 305, the control may be complicated because there are cases where the differential coefficient is positive and where the differential coefficient is negative. There is a problem that a point such as the point A having a small differential gain has to be used. The point A and the point C do not have a symmetrical relation because the transmission characteristic of the etalon is not an exact sine function. In order to solve the problem, a third etalon of which phase is shifted by $\pi/2$ may be used. However, in this case, there is a problem that a scale of the system is enlarged.

In the following embodiments, a description will be given of a system to control a wavelength and a method to control a wavelength that are capable of controlling a wavelength with high accuracy at a high speed with a simple structure.

First Embodiment

Figure 6:
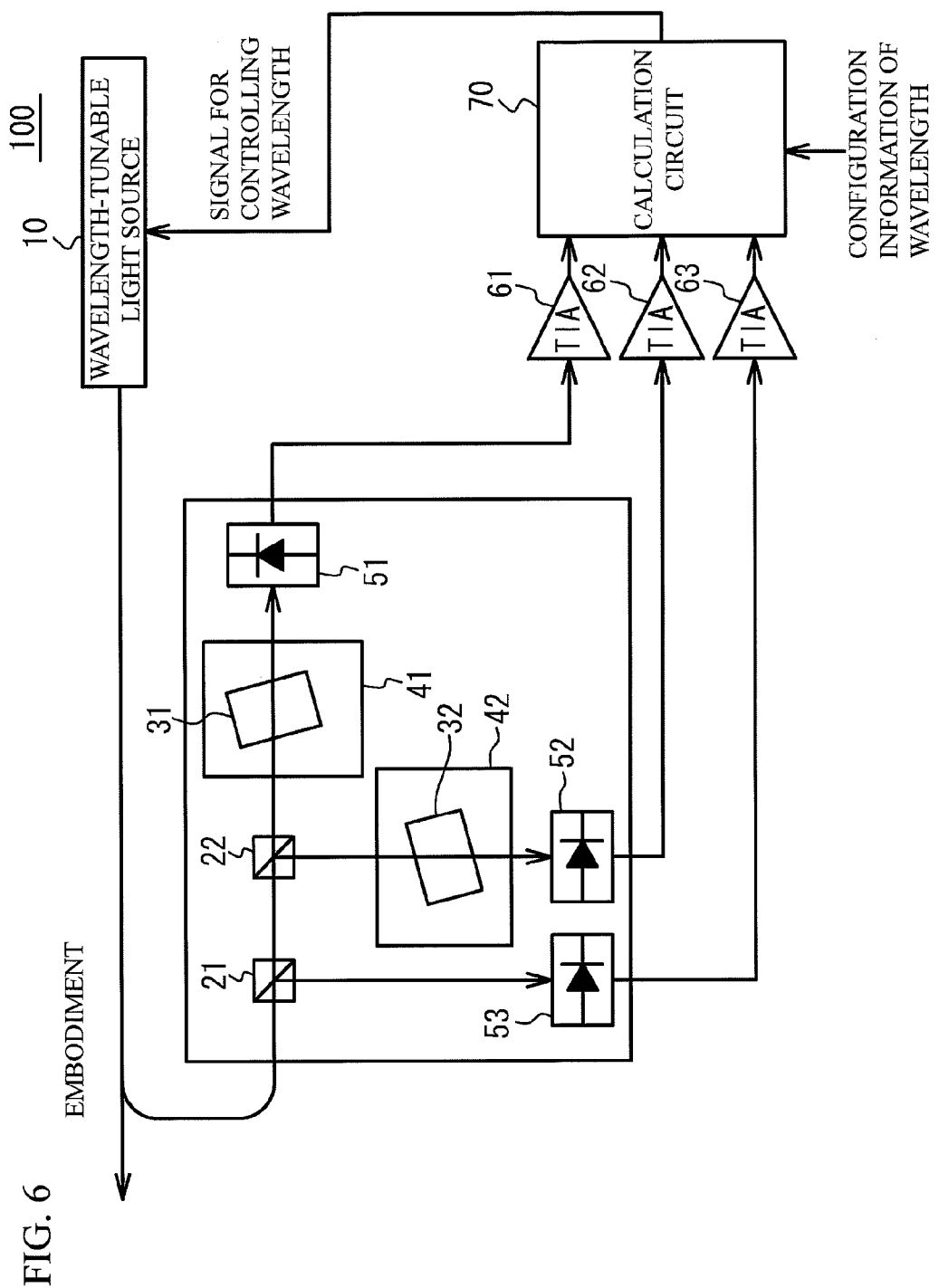
FIG. 6 illustrates an overall structure of a system to control a wavelength in accordance with a first embodiment.

FIG. 6 illustrates an overall structure of a system 100 to control a wavelength in accordance with a first embodiment. As illustrated in FIG. 6, the system 100 to control a wavelength has a wavelength-tunable light source 10, a first beam splitter 21, a second beam splitter 22, a first etalon 31, a second etalon 32, a first device 41 to control a temperature, a second device 42 to control a temperature, a first photodiode 51, a second photodiode 52, a third photodiode 53, TIAs 61 to 63, a calculation circuit 70 and so on.

The wavelength-tunable light source 10 is a light source to output a light with a single wavelength. The wavelength-tunable light source 10 has a semiconductor laser, a drive circuit, a device to control a temperature, or the like. An output wavelength of the wavelength-tunable light source 10 is controlled according to a signal to control a wavelength input from the calculation circuit 70. The signal to control a wavelength includes information such as a drive current for oscillation of the wavelength-tunable light source 10 at a desirable wavelength, a current for controlling a temperature of the wavelength-tunable light source 10, a signal for changing a wavelength or the like. A part of an output light of the wavelength-tunable light source 10 is input into the first beam splitter 21.

One of two branched lights output by the first beam splitter 21 is input into the second beam splitter 22. One of two branched lights outputs by the second beam splitter 22 transmits the first etalon 31 and is input into the first photodiode 51. The other of the two branched lights output by the second beam splitter 22 transmits the second etalon 32 and is input into the second photodiode 52. The other of the two branched lights output by the first beam splitter 21 is input into the third photodiode 53 without transmitting an etalon.

The first etalon 31 is arranged on the first device 41 to control a temperature. The second etalon 32 is arranged on the second device 42 to control a temperature. The first device 41 to control a temperature and the second device 42 to control a temperature are, for example, TECs (Thermo Electric Cooler) and include a Peltier element. The first device 41 to control a temperature controls a temperature of the first etalon 31. The second device 42 to control a temperature controls a temperature of the second etalon 32.

The TIA 61 converts a current signal obtained by an optical electrical conversion of the first photodiode 51 into a voltage signal, and inputs the voltage signal into the calculation circuit 70. An output of the TIA 61 is hereinafter referred to as an output PD1. The TIA 62 converts a current signal obtained by an optical electrical conversion of the second photodiode 52 into a voltage signal, and inputs the voltage signal into the calculation circuit 70. An output of the TIA 62 is hereinafter referred to as an output PD2. The TIA 63 converts a current signal obtained by an optical electrical conversion of the third photodiode 53 into a voltage signal, and inputs the voltage signal into the calculation circuit 70. An output of the TIA 63 is hereinafter referred to as an output PD3.

The first etalon 31 and the second etalon 32 have an identical FSR. A transmission characteristic of the first etalon 31 is shifted by FSR/4 ($\pi/2$ in phase) in a frequency direction with respect to that of the second etalon 32. The shift of the transmission characteristic may be achieved by a temperature control of the first device 41 to control a temperature or the second device 42 to control a temperature, an arrangement angle of the etalons, or the like.

As illustrated in FIG. 4, a transmission characteristic of an etalon can be approximately considered as a sine function. When a phase of the transmission characteristic is shifted by $\pi/2$ (FSR/4), the transmission characteristic can be approximately considered as a cosine function. And so, the calculation circuit 70 generates a pseudo sine function and a pseudo cosine function from the output PD1 and the output PD2. It is necessary to perform a calibration so that a wavelength average of the output PD1 and the output PD2 are zero, in addition to adequately designing a reflection ratios of the first etalon 31 and the second etalon 32 (Finesse of etalon).

The output PD3 is used for the calibration. In concrete, when wavelength averages of the output PD1 and the output PD2 (a broken line of FIG. 4) are respectively subtracted from the output PD1 and the output PD2, a pseudo sine function and a pseudo cosine function are obtained. In an operation of the system 100 to control a wavelength, it is not possible to obtain wavelength averages of the output PD1 and the output PD2. Therefore, an input optical wavelength may be scanned in a whole wavelength range to be monitored, and an average of a ratio of the output PD3 and the output PD1 and a ratio of the output PD3 and the output PD2 may be obtained in advance. The ratios are defined as a constant A and a constant B. The wavelength averages of the output PD1 and the output PD2 can be obtained when A×PD3 and B×PD3 are calculated, even if an optical input level fluctuates. The calibration may be achieved by an analog circuit out of the calculation circuit 70.

The pseudo sine function may be expressed by the following formula (1). The pseudo cosine function may be expressed by the following formula (2). The constant A may be expressed by the following formula (3). The constant B may be expressed by the following formula (4).

$$\text{Pseudo sine function} = PD1 - A \cdot PD3 \qquad \text{[Formula 1]}$$

$$\text{Pseudo cosine function} = PD2 - B \cdot PD3 \qquad \text{[Formula 2]}$$

$$A = \overline{\left(\frac{PD1}{PD3}\right)} \qquad \text{[Formula 3]}$$

$$B = \overline{\left(\frac{PD2}{PD3}\right)} \qquad \text{[Formula 4]}$$

When a ratio of the pseudo sine function and the pseudo cosine function is obtained, a pseudo tangent function may be obtained. A pseudo tangent function X may be expressed by the following formula (5). A pseudo tangent function Y may be expressed by the following formula (6). In the formulas (5) and (6), an output of the TIA (a voltage signal) is used. However, the output of the first photodiode 51 may be defined as the PD1, the output of the second photodiode 52 may be defined as the PD2, and the output of the third photodiode 53 may be defined as the PD3.

$$X = (PD1 - A \cdot PD3)/(PD2 - B \cdot PD3) \qquad \text{[Formula 5]}$$

$$Y = (PD2 - B \cdot PD3)/(PD1 - A \cdot PD3) \qquad \text{[Formula 6]}$$

Figure 7:
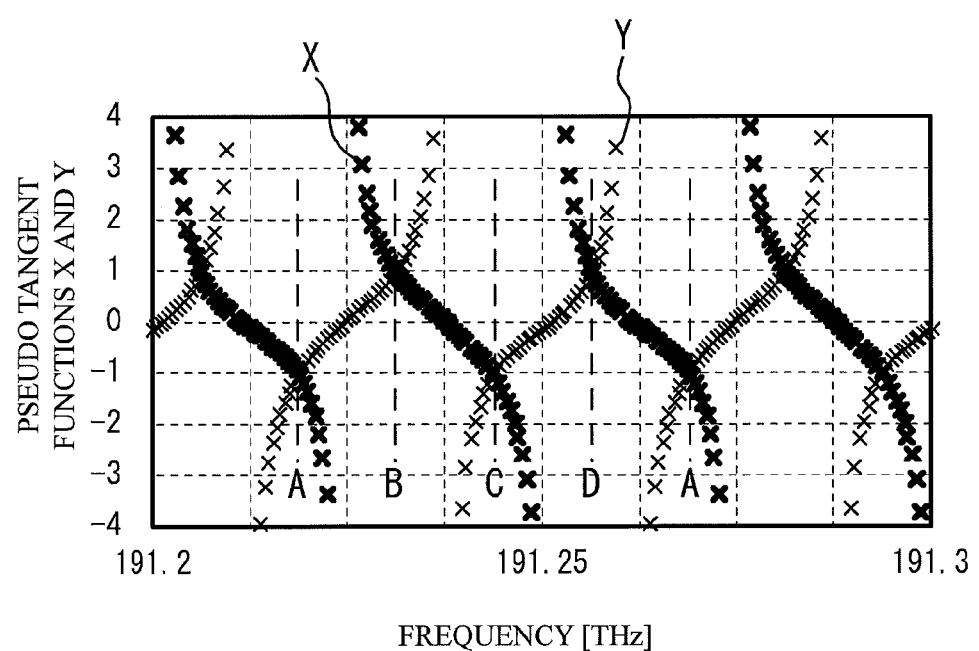
FIG. 7 illustrates pseudo tangent functions X and Y.

FIG. 7 illustrates the pseudo tangent functions X and Y. In FIG. 7, each thick "X" indicates a point of the pseudo tangent function X. Each thin "X" indicates a point of the pseudo tangent function Y. In the system 100 to control a wavelength, the wavelength control may be performed with use of values of Y in a region from a point A to a point B and a region from a point C to a point D and with use of values of X in a region from the point B to the point C and a region from the point D to the point A. Configuration information of a wavelength determines with which of the values of X and the values of Y, the wavelength control is performed.

Figure 8A:
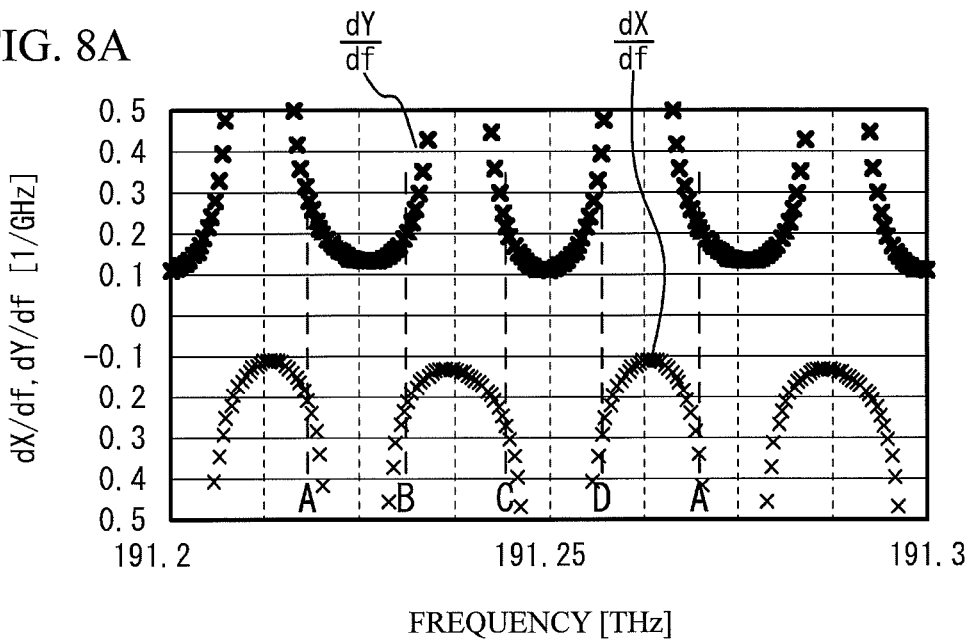
FIG. 8A illustrates differential coefficients calculated from pseudo tangent functions X and Y of FIG. 7.
Figure 8B:
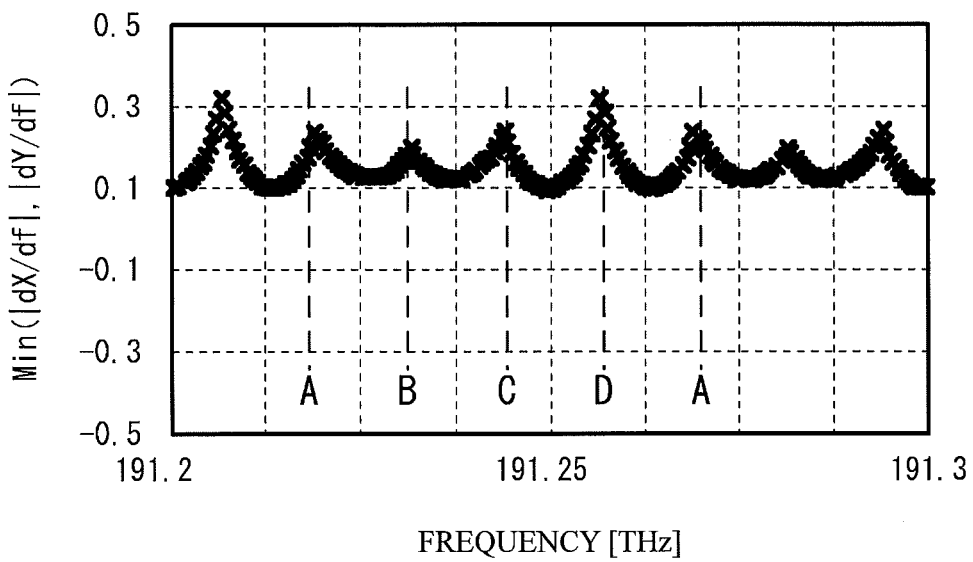
FIG. 8B illustrates a graph obtained by tracing one of two differential gains having a smaller absolute value.

FIG. 8A illustrates differential coefficients calculated from the pseudo tangent functions X and Y of FIG. 7. In comparison with FIG. 5, differential coefficients having a larger absolute value is obtained. When the values of Y are used, the differential coefficient is fixed to positive. When the values of X are used, the differential coefficient is fixed to negative. FIG. 8B illustrates a graph obtained by tracing one of the two differential gains having a smaller absolute value. In this manner, the gain gets larger at points where the value of X and the value of Y are switched.

Actually, a digital technology may be used for the calculation circuit 70. The signals of the output PD1 to PD3 are digitalized through an AD (Analog/Digital) convertor. A calculation is performed in a FPGA (Field Programmable Gate Array). A signal for controlling a wavelength that is a calculation result is converted into an analog signal through a DA (Digital/Analog) convertor. And, the analog signal is supplied to the wavelength-tunable light source. When the FPGA is used, a high-speed control can be achieved. A CPU (Central Processing Unit) may be used instead of the FPGA. Generally, when the CPU is used, a cost is reduced although the speed is reduced.

Figure 9:
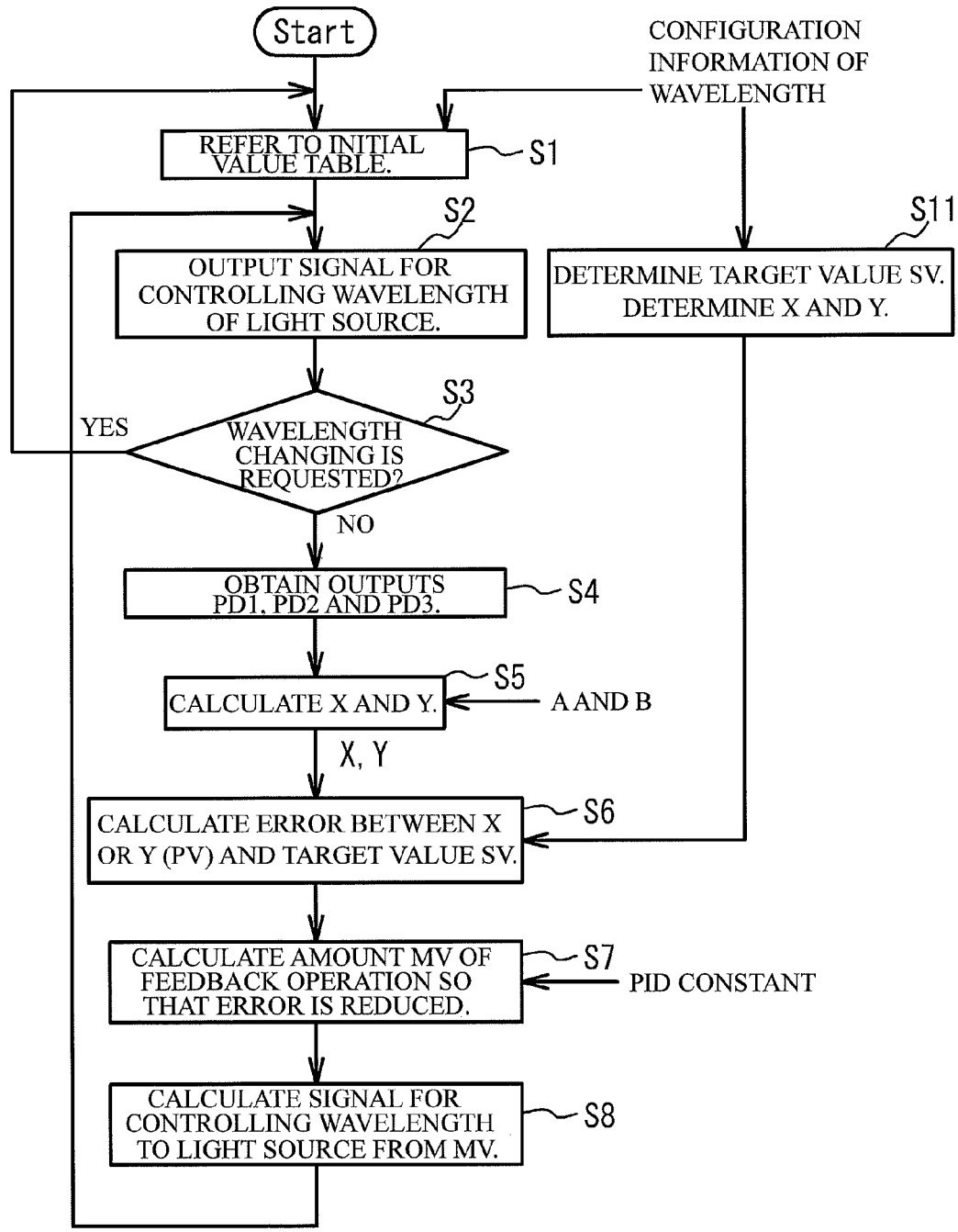
FIG. 9 illustrates an example of a flowchart of an operation of a wavelength control.

FIG. 9 illustrates an example of a flowchart of an operation of the wavelength control. As illustrated in FIG. 9, the calculation circuit 70 refers to an initial value table according to input configuration information of a wavelength (Step S1). Table 1 is an example of the initial value table.

TABLE 1

| CHANNEL | FREQUENCY[THz] | TARGET VALUE | FUNCTION |
|---|---|---|---|
| 1 | 191.40000 | V1 | Y |
| 2 | 191.40625 | V2 | Y |
| 3 | 191.41250 | V3 | X |
| 4 | 191.41875 | V4 | Y |
| . | . | . | . |
| . | . | . | . |
| . | . | . | . |

With reference to the Table 1, in the initial value table, a target value and a function used for a feedback control of the pseudo tangent functions X and Y are related to each initial wavelength. The initial value table includes data such as drive current values for an oscillation of the wavelength-tunable light source 10 at each initial wavelength, current values for the temperature control of the wavelength-tunable light source 10, signals for changing a wavelength, target temperature values of the first device 41 to control a temperature and the second device 42 to control a temperature or the like. As an example, a wavelength of integral multiple of 6.25 GHz regulated in ITU-T G.694.1 may be used as each wavelength.

The calculation circuit 70 refers to an initial value of a wavelength that is the closest to a setting wavelength included in the configuration information of a wavelength, as an example. The calculation circuit 70 may refer to an initial value itself stored in the initial value table. The calculation circuit 70 may obtain a value in which the initial value is calculated. For example, in the flexible grid, it is not realistic that a table includes all wavelengths of integral multiple of 6.25 GHz. Therefore, a thinning process may be performed. In this case, deleted wavelengths may be calculated by an interpolation.

Next, the calculation circuit 70 outputs the drive current, the current value for temperature control and so on which are referred to in the Step S1 into the wavelength-tunable light source 10 as a signal for controlling a wavelength (Step S2). The wavelength-tunable light source 10 optically outputs in accordance with the signal for controlling a wavelength. Next, the calculation circuit 70 determines whether a wavelength switching is requested (Step S3). When it is determined as "Yes" in the Step S3, the Step S1 is executed again. When it is determined as "No" in the Step S3, the calculation circuit 70 obtains the outputs PD1 to PD3 (Step S4). Next, the calculation circuit 70 calculates values of the pseudo tangent functions X and Y as measurement values (Step S5). In this case, the calculation circuit 70 uses the constants A and B.

Figure 10:
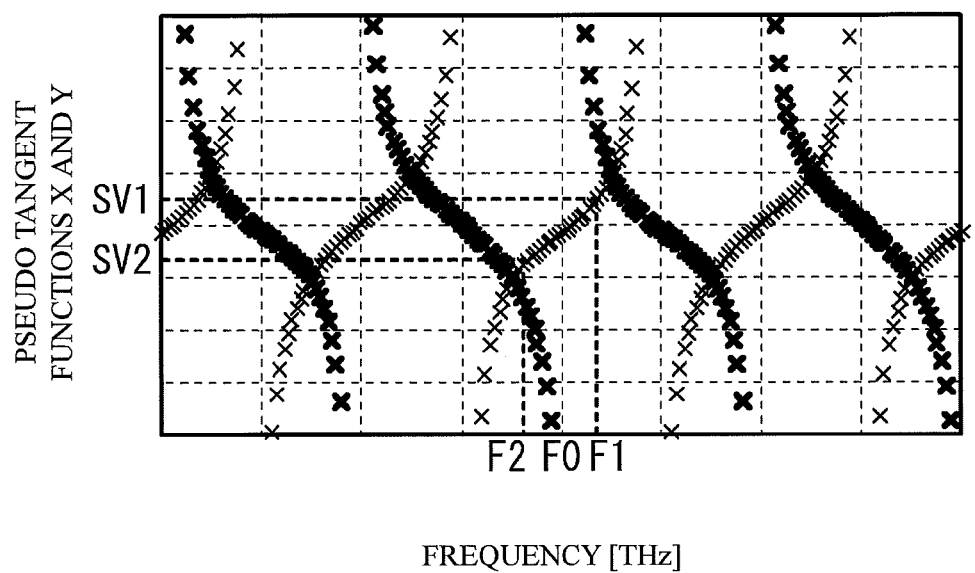
FIG. 10 illustrates details of Step S11.

The calculation circuit 70 determines a target value SV in accordance with the configuration information of a wavelength in parallel with the Steps S1 to S5, and determines which of the pseudo tangent functions X and Y is used (Step S11). FIG. 10 illustrates details of the Step S11. As illustrated in FIG. 10, the calculation circuit 70 determines which of the pseudo tangent functions X and Y is used. When a setting wavelength is a frequency F1, the pseudo tangent function Y is used. The calculation circuit 70 refers to an initial value relating to an initial wavelength F0 close to the frequency F1 from the initial value table. When the frequency F1 is the setting wavelength, the calculation circuit 70 calculates a target value SV1 as the target value SV. When a frequency F2 is a setting wavelength, the calculation circuit 70 calculates a target value SV2 as the target value SV. The target value may be calculated with use of an algorism from the configuration information of a wavelength, or may be stored in the initial value table.

Next, the calculation circuit 70 calculates an error between the measured value obtained in the Step S5 and the target value SV obtained in the Step S11 (Step S6). Next, the calculation circuit 70 calculates an amount MV of feedback operation so that an absolute value of the error calculated in the Step S6 is reduced (Step S7). For example, when the absolute value of the amount MV of feedback operation is large, the amount MV indicates that a correction amount is large. When the absolute value of the amount MV of feedback operation is small, the amount MV indicates that the correction amount is small. The calculation circuit 70 uses a PID (Proportional Integral Derivative) constant for calculation of the amount MV of feedback operation. The PID constant is such as a proportional constant, an integral constant, a differential constant or the like of the PID control. Next, the calculation circuit 70 calculates a signal for controlling a wavelength to the wavelength-tunable light source 10 from the amount MV of feedback operation (Step S8). After that, the Step S2 is executed. When the configuration information of a wavelength is changed to the frequency F2, the above-mentioned target value SV1 is changed to the target value SV2, and the same operation is performed.

In the embodiment, three values of two optical powers after transmission of two etalons that have an identical FSR and having phases different from each other by $\pi/2$ and whole optical power input into the two etalons are used, and a monitor signal responding to a wavelength similarly to a pseudo tangent function is generated. Therefore, a wavelength control can be achieved with high accuracy. In concrete, when a pseudo tangent function is calculated with use of the outputs PD1 to PD3, a monitoring can be achieved with a large differential coefficient in the whole wavelength range. It is not necessary to change a temperature of an etalon with respect to each setting wavelength. Therefore, a high-speed operation can be achieved. The number of etalons is suppressed. Therefore, a structure is simplified.

In the above-mentioned description, it is presupposed that a feedback control is repeated. However, the structure is not limited. When a drift amount is under an allowable condition (drift amount is small, or only a brief lock is needed), it is not essential that the feedback control is repeated.

In the above-mentioned description, each temperature of two etalons is controlled so that a difference between transmission characteristics of the two etalons is FSR/4. However, when the characteristic difference can be adequately adjusted in advance by enlarging assembly accuracy, it is not always necessary to control the temperature individually. The temperatures may be identical. Under a condition allowing temperature changing (temperature changing is small, characteristic changing of an etalon caused by the temperature changing is small, etc.), the temperature control itself is not needed.

It is presupposed that the two etalons have an identical FSR. However, the difference between transmission characteristics of the two etalons is not always FSR/4. The characteristics of the two etalons have only to be different so that the difference is not zero or $\pi$. However, when the difference of the characteristics of the two etalons is large, variation may occur in the gain for differential.

FIG. 11A illustrates transmission characteristics in a case where the difference of the transmission characteristics of the two etalons is reduced by 12% from FSR/4. FIG. 11B illustrates an absolute value of the differential gain of the two transmission characteristics of FIG. 11A. FIG. 11C illustrates the pseudo tangent functions X and Y of the characteristics of FIG. 11A. FIG. 11D illustrates an absolute value of the differential gains of FIG. 11C. As illustrated in FIG. 11D, variation occurs in the differential gains.

FIG. 12A illustrates transmission characteristics in a case where the difference of the transmission characteristics of the two etalons is increased by 12% from FSR/4. FIG. 12B illustrates an absolute value of the differential gain of the two transmission characteristics of FIG. 12A. FIG. 12C illustrates the pseudo tangent functions X and Y of the characteristics of FIG. 12A. FIG. 12D illustrates an absolute value of the differential gains of FIG. 12C. As illustrated in FIG. 12D, variation occurs in the differential gains.

Accordingly, when the transmission characteristic of the two etalons is shifted by more than 10% from FSR/4, the variation occurs in the differential gain. It is therefore preferable that the difference of the transmission characteristics of the two etalons is within FRS/4 plus-minus 10%.

The present invention is not limited to the specifically disclosed embodiments and variations but may include other embodiments and variations without departing from the scope of the present invention.

What is claimed is:

1. A system to control a wavelength comprising:
a splitter configured to branch an optical signal output by a wavelength-tunable light source into a first to a third optical signals;
a first photodiode configured to perform an optical electrical conversion of the first optical signal transmitting a first etalon;
a second photodiode configured to perform an optical electrical conversion of the second optical signal transmitting a second etalon, an FSR of the second etalon being identical to that of the first etalon, peak wavelengths of intensity of a transmitted light of the second etalon being different from those of the first etalon;
a third photodiode configured to perform an optical electrical conversion of the third optical signal; and
a controller configured to control the wavelength-tunable light source with use of a coefficient calculated by following formulas (1) and (2) of which absolute value is smaller, $$\text{Coefficient}=(PD1-A\cdot PD3)/(PD2-B\cdot PD3) \quad (1)$$

$$\text{Coefficient}=(PD2-B\cdot PD3)/(PD1-A\cdot PD3) \quad (2)$$

wherein:
PD1 is an output of the first photodiode;
PD2 is an output of the second photodiode;
PD3 is an output of the third photodiode;
A is an average of a ratio of PD1 with respect to PD3; and
B is an average of a ratio of PD2 with respect to PD3.

2. The system as claimed in claim 1, wherein the controller performs a feedback control of the wavelength-tunable light source with use of the formula.

3. The system as claimed in claim 2, wherein the controller controls the wavelength-tunable light source based on an initial value that is obtained according to configuration information of a wavelength before the feedback control.

4. The system as claimed in claim 3, wherein the initial value is stored in a table that is made in advance.

5. The system as claimed in claim 1, wherein the peak wavelengths of the first etalon are different from those of the second etalon within plus-minus 10% of FSR/4 to suppress variation in a differential gain of the formulas.

6. A method to control a wavelength comprising:
branching an optical signal output by a wavelength-tunable light source into a first to a third optical signals;
performing an optical electrical conversion of the first optical signal transmitting a first etalon with a first photodiode;
performing an optical electrical conversion of the second optical signal transmitting a second etalon with a second photodiode, an FSR of the second etalon being identical to that of the first etalon, peak wavelengths of intensity of a transmitted light of the second etalon being different from those of the first etalon;
performing an optical electrical conversion of the third optical signal with a third photodiode; and
controlling the wavelength-tunable light source with use of a coefficient calculated by following formulas (1) and (2) of which absolute value is smaller, $$\text{a coefficient} = (PD1 - A \cdot PD3)/(PD2 - B \cdot PD3) \quad (1)$$

$$\text{a coefficient} = (PD2 - B \cdot PD3)/(PD1 - A \cdot PD3) \quad (2)$$

wherein:
PD1 is an output of the first photodiode;
PD2 is an output of the second photodiode;
PD3 is an output of the third photodiode;
A is an average of a ratio of PD1 with respect to PD3; and
B is an average of a ratio of PD2 with respect to PD3.

7. The method as claimed in claim 6 further comprising performing a feedback control of the wavelength-tunable light source with use of the formula.

8. The method as claimed in claim 7, wherein the wavelength-tunable light source is controlled based on an initial value that is obtained according to configuration information of a wavelength before the feedback control.

9. The method as claimed in claim 8, wherein the initial value is stored in a table that is made in advance.

10. The method as claimed in claim 6, wherein the peak wavelengths of the first etalon are different from those of the second etalon within plus-minus 10% of FSR/4 to suppress variation in a differential gain of the formulas.

11. A system to control a wavelength comprising:
a splitter configured to branch an optical signal output by a wavelength-tunable light source into a first to a third optical signals;
a first photodiode configured to perform an optical electrical conversion of the first optical signal transmitting a first etalon;
a second photodiode configured to perform an optical electrical conversion of the second optical signal transmitting a second etalon, an FSR of the second etalon being identical to that of the first etalon, peak wavelengths of intensity of a transmitted light of the second etalon being different from those of the first etalon;
a third photodiode configured to perform an optical electrical conversion of the third optical signal; and
a controller configured to control the wavelength-tunable light source with use of a coefficient calculated by following one of formulas (1) and (2), wherein a coefficient calculated by following formula (1) is used on a condition that an absolute value of the coefficient is less than an absolute value of a coefficient calculated by following formula (2), and otherwise the coefficient calculated by following formula (2) is used, $$\text{Coefficient} = (PD1 - A \cdot PD3)/(PD2 - B \cdot PD3) \quad (1)$$

$$\text{Coefficient} = (PD2 - B \cdot PD3)/(PD1 - A \cdot PD3) \quad (2)$$

wherein:
PD1 is an output of the first photodiode;
PD2 is an output of the second photodiode;
PD3 is an output of the third photodiode;
A is an average of a ratio of PD1 with respect to PD3; and
B is an average of a ratio of PD2 with respect to PD3.

12. The system as claimed in claim 11, wherein the controller performs a feedback control of the wavelength-tunable light source with use of the formula.

13. The system as claimed in claim 12, wherein the controller controls the wavelength-tunable light source based on an initial value that is obtained according to configuration information of a wavelength before the feedback control.

14. The system as claimed in claim 13, wherein the initial value is stored in a table that is made in advance.

15. The system as claimed in claim 11, wherein the peak wavelengths of the first etalon are different from those of the second etalon within plus-minus 10% of FSR/4 to suppress variation in a differential gain of the formulas.

* * * * *